(12) United States Patent
Yang et al.

(10) Patent No.: US 7,163,902 B2
(45) Date of Patent: *Jan. 16, 2007

(54) INFRA-RED LIGHT-EMITTING DEVICE AND METHOD FOR PREPARING THE SAME

(75) Inventors: Tsun Neng Yang, Taipei (TW); Shan Ming Lan, Dasi Township, Taoyuan County (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 138 days.

This patent is subject to a terminal disclaimer.

(21) Appl. No.: 10/925,437

(22) Filed: Aug. 25, 2004

(65) Prior Publication Data

US 2006/0043397 A1    Mar. 2, 2006

(51) Int. Cl.
*H01L 21/31* (2006.01)
(52) U.S. Cl. .................. 438/787; 438/778; 438/962; 438/22; 257/E21.002
(58) Field of Classification Search ............ 438/778, 438/787, 962, 22
See application file for complete search history.

(56) References Cited

U.S. PATENT DOCUMENTS

| 5,354,707 A | 10/1994 | Chapple-Sokol et al. |
| 5,789,267 A * | 8/1998 | Hsia et al. ............... 438/396 |
| 6,323,142 B1 * | 11/2001 | Yamazaki et al. ......... 438/790 |
| 2004/0106285 A1 | 6/2004 | Zacharias |

FOREIGN PATENT DOCUMENTS

| EP | 0899796 | 3/1999 |
| WO | WO 2004066346 | 8/2004 |

OTHER PUBLICATIONS

L.T. Canham, Silicon Quantum Wire Array Fabrication by Electrochemical and Chemical Dissolution of Wafers, Appl. Phys. Lett., 57, 1046 (1990).

Mykola Sopinskyy and Viktoriya Khomchenko, Electroluminescence in SiOx Films and SiOx-film-based Systems, Current Opinion in Solid State and Material Science, 7 (2003) 97-109.

* cited by examiner

*Primary Examiner*—Zandra V. Smith
*Assistant Examiner*—Christy Novacek
(74) *Attorney, Agent, or Firm*—Egbert Law Offices

(57) ABSTRACT

The present infra-red light-emitting device includes a substrate with a first window layer, a silicon dioxide layer positioned on the first window layer, silicon nanocrystals distributed in the silicon dioxide layer, a second window layer, a transparent conductive layer and a first ohmic contact electrode positioned in sequence on the silicon dioxide layer, and a second ohmic contact electrode positioned on the bottom surface of the substrate. The present method forms a sub-stoichiometric silica ($SiO_x$) layer on a substrate, wherein the numerical ratio (x) of oxygen atoms to silicon atoms is smaller than 2. A thermal treating process is then performed in a nitrogen or argon atmosphere to transform the $SiO_x$ layer into a silicon dioxide layer with a plurality of silicon nanocrystals distributed therein. The thickness of the silicon dioxide layer is between 1 and 10,000 nanometers, and the diameter of the silicon nanocrystal is between 4 and 8 nanometers.

7 Claims, 4 Drawing Sheets

INFRA-RED LIGHT-EMITTING DEVICE AND METHOD FOR PREPARING THE SAME

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to an infra-red light-emitting device and method for preparing the same, and more particularly, to an infra-red light-emitting device with a silicon-containing active layer and method for preparing the same.

BACKGROUND OF THE INVENTION

An infra-red light-emitting diode (LED) is mainly used in the optical communication industry. However, as semiconductor laser diode (LD) technology matures, the light source using the LED such as infra-red light LED with a wavelength between 1310 nm and 1550 nm, originally used in glass optical fiber, has been replaced by LD gradually so as to increase transmission distance. Network connection in the family and the multimedia such as digital video primarily uses plastic fiber and red LED with a wavelength between 650 and 670 nm. Therefore, currently available application of infra-red LED is sensors, remote controllers, etc., which operates at a wavelength between 850 and 950 nm. At present, optoelectronic components, particularly light-emitting components, are manufactured by epitaxial technology using elements in III-V group or II-VI group with a direct band-gap in periodical table as the raw material.

Since the invention of the transistor in 1947, silicon has always played an important role in the integrated circuit industry. According to the prediction of the Moore's Law, the size of the integrated circuit device will shrink to half of the original size at an interval of about 18 months. The basis of the Moore's Law is the innovation of new technology and the development of potential applications, wherein silicon is an important milestone in this fast progress. With years of development, silicon is the most complete and inexpensive material used in the integrated circuit fabrication. Therefore, the light-emitting device can be integrated into the very large scale integration (VLSI) circuit if silicon can be further developed to serve as a light-emitting device.

At room temperature, silicon, an element of IV group in the periodic table, is an inefficient light-emitting source because it is one of the indirect band-gap materials with a very low radioactive recombination rate and an internal quantum efficiency of only about $10^{-6}$ to $10^{-7}$, so that silicon has not been used as a light-emitting source. As a result, silicon is only used in light receiving devices such as detector, charge coupled device (CCD), array type video sensor and solar battery in photoelectric industry.

In 1990, a British L. T. Canham found that porous silicon (PSi) generated by anode electrolysis of silicon in hydrofluoric acid solvent can emit a visible light at high efficiency (See: Canham L. T., Appl. Phys. Lett., 57, 1046 (1990)). This important discovery prompted research teams in many countries to develop the silicon light source. During 2000 to 2003, many academic research institutes and researchers all over the world participated in the development of a silicon-based LED and gained some great result (See: Mykola Sopinskyy and Viktoriya Khomchenko, Current Opinion in Solid State and Material Science 7(2003) 97–109.). However, there are so far still not any commercial optoelectronic products such as LED in spite of preferable result in research and development of silicon-based LED at present.

Due to the sponge-like structure, the porous silicon has some major defects in the application to the light-emitting device. As to the mechanical property, the porous silicon is inappropriate to be integrated with the standard semiconductor fabrication process for the frangibility of the former. In addition, the porous silicon is highly reactive in chemical properties and is likely to react with oxygen in the atmosphere, which results in the degradation of the photoelectric property. The degradation of the photoelectric property causes more difficulty in controlling the variation of the photoelectric properties with time.

BRIEF SUMMARY OF THE INVENTION

The objective of the present invention is to provide an infra-red light-emitting device with a silicon-containing active layer and method for preparing the same.

In order to achieve the above-mentioned objective, and to avoid the problems of the prior art, the present invention provides an infra-red light-emitting device with a silicon-containing active layer and method for preparing the same. The present infra-red light-emitting device comprises a substrate with an upper surface and a bottom surface, a first window layer positioned on the upper surface, a silicon dioxide layer positioned on the first window layer, a plurality of silicon nanocrystals distributed in the silicon dioxide layer, a second window layer positioned on the silicon dioxide layer, a transparent conductive layer positioned on the second window layer, a first ohmic contact electrode positioned on the transparent conductive layer, and a second ohmic contact electrode positioned on the bottom surface. The substrate can be a p-silicon substrate or an n-silicon substrate. The first window layer and the second window layer are preferably made of microcrystal-SiC, amorphous-SiC, or gallium nitride. The transparent conductive layer is preferably made of indium tine oxide. The first ohmic contact electrode is preferably made of aluminum, nickel or an alloy consisting of nickel and aluminum. The thickness of the silicon dioxide layer is between 1 and 10,000 nanometers, and the diameter of the silicon nanocrystal is between 4 and 8 nanometers.

According to another embodiment of the present invention, an infra-red light-emitting device comprises a substrate, a first window layer positioned on the substrate, a silicon dioxide layer position on a portion of surface of the first window layer, a plurality of silicon nanocrystals distributed in the silicon dioxide layer, a second window layer positioned on the silicon dioxide layer, a transparent conductive layer positioned on the second window layer, a first ohmic contact electrode positioned on the transparent conductive layer, and a second ohmic contact electrode positioned on another portion of a surface of the first window layer. The first window layer and the second window layer are made of amorphous-SiC, microcrystal-SiC or gallium nitride, and the substrate is a quartz substrate or a sapphire substrate.

The method for preparing the infra-red light-emitting device first forms a sub-stoichiometric silica ($SiO_x$) layer on a substrate, wherein the numerical ratio (x) of oxygen atoms to silicon atoms is smaller than 2. At least one thermal treating process is then performed to transform the sub-stoichiometric silica layer into a silicon dioxide layer with a plurality of silicon nanocrystals distributed in the silicon dioxide layer. The sub-stoichiometric silica layer is formed on the substrate by an atmospheric pressure chemical vapor deposition (APCVD), wherein the process temperature is between 700 and 1100° C., and the process time is between 1 and 300 minutes. The APCVD process uses dichlorosilane ($SiH_2Cl_2$) and nitrous oxide ($N_2O$) at a flow ratio between 1:10 and 10:1 as reaction gases. In addition, silane ($SiH_4$) and nitrous oxide at a flow ratio between 1:10 and 10:1 can also be used as reaction gases. The APCVD uses hydrogen, nitrogen or argon as a carrier gas to deliver the reaction gas into a reaction chamber.

The thermal treating process includes a first treating procedure and a second treating procedure. The first treating procedure is performed in a nitrogen or argon atmosphere to grow the silicon nanocrystal, wherein the treating temperature is between 800 and 1300° C., and the treating period is between 1 and 300 minutes. The second procedure is performed in a hydrogen atmosphere to perform a hydrogen passivation for the silicon nanocrystals, wherein the treating temperature is between 500 and 600° C., and the treating period is between 1 and 120 minutes.

BRIEF DESCRIPTION OF THE SEVERAL VIEWS OF THE DRAWINGS

Other objectives and advantages of the present invention will become apparent upon reading the following description and upon reference to the accompanying drawings.

DETAILED DESCRIPTION OF THE INVENTION

Figure 1:
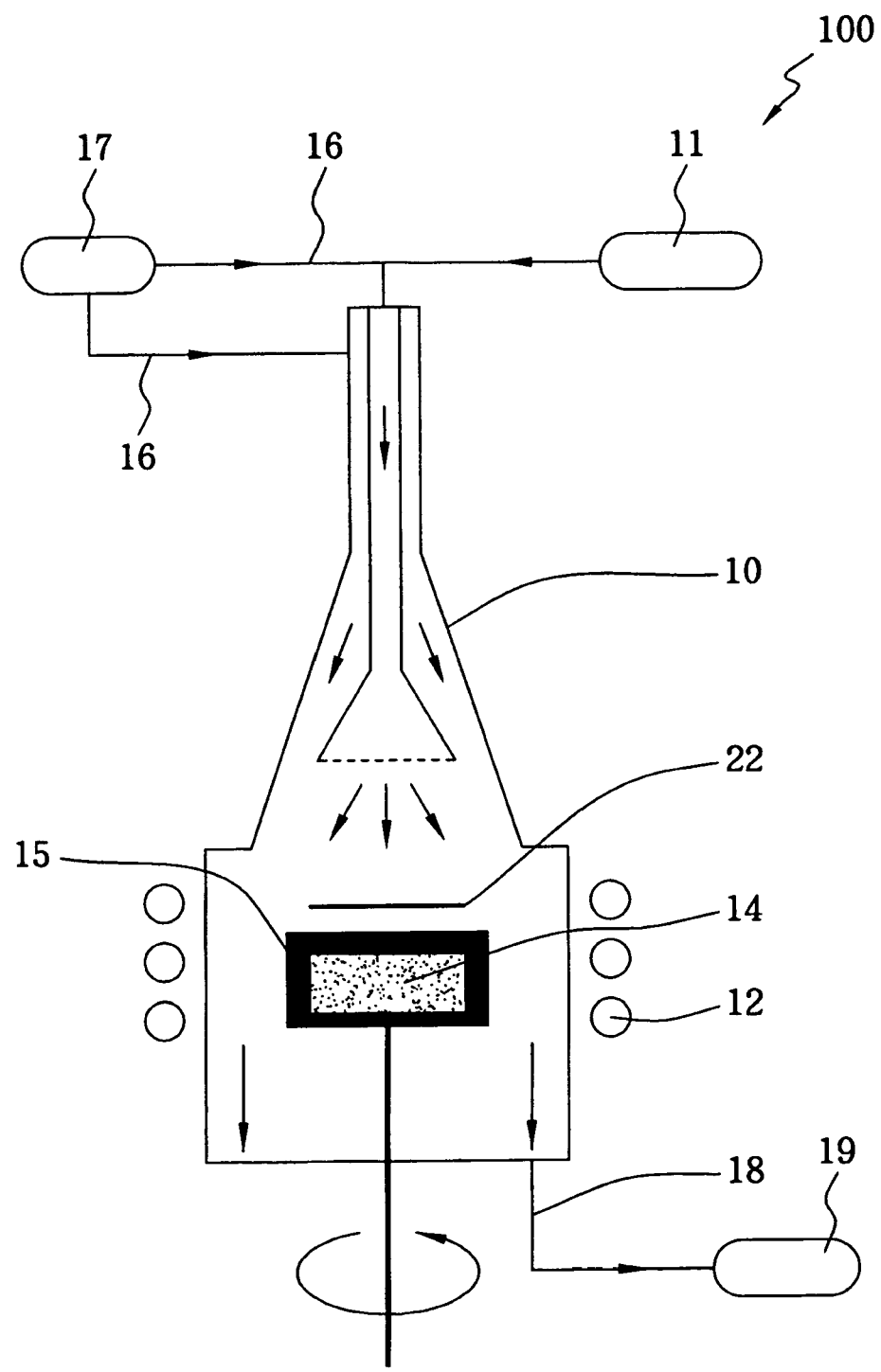
FIG. 1 is a schematic view of a diagram of an APCVD apparatus.

The quantum confinement effect broadens the band-gap of materials as the size of the material becomes smaller, and the nanocrystal has a distinct photoelectric property from the ordinary crystal with a larger size. Therefore, besides the well-known porous silicon, researchers also attempted to prepare the silicon-based light source by generating silicon nanocrystals (Si—NC) in a highly stable silicon dioxide layer.

The present method for preparing the Si—NC first forms a sub-stoichiometric silica ($SiO_x$) layer with excess of silicon by chemical vapor deposition (CVD), wherein the numerical ratio (x) of oxygen atoms to silicon atoms is smaller than 2. At least one high temperature annealing process is then carried out to respectively separate two different metallurgical phases (silicon and silicon dioxide), and to form the Si—NC with an order structure and the silicon dioxide with an amorphous structure simultaneously, wherein the silicon dioxide layer serves as a matrix for the Si—NC to lodge therein. Due to the amorphous structure of the silicon dioxide, it is strain-free between the Si—NC and the silicon dioxide. The crystal size and density of the Si—NC can be controlled by the process parameters such as the deposition temperature, annealing temperature, etc.

Another method for preparing the Si—NC uses ion implantation technology. Ion implantation technology has matured and been used in fabricating large-scale semiconductor integrated circuit. With the ion implantation technology, accelerated silicon ions are implanted into the silicon dioxide layer directly to form excessive silicon atoms in a portion of the silicon dioxide layer. An annealing process is then carried out to activate nucleation of excessive silicon atoms to form the Si—NC lodged in the silicon dioxide layer, which serves as the matrix for the Si—NC.

With ion implantation technology, excessive silicon concentration and distribution profile can be achieved within a predetermined region and depth by adjusting the energy and dosage of the implanted ion. In addition, many structural defects will be formed during the ion implantation process, which can decrease the activation energy of diffusion to lower the required annealing temperature for metallurgical phase separation accordingly. However, compared with the chemical vapor deposition process, the implantation time to form excessive silicon atom concentration by the ion implantation technology is too long to be applied to preparing the active layer of the light-emitting device.

According to the deposition temperature (from 100 to 1000° C.) and pressure (from the atmospheric pressure to 7 Pa), the chemical vapor deposition widely used in semiconductor fabrication can be divided into atmospheric pressure chemical vapor deposition (APCVD), low pressure chemical vapor deposition (LPCVD) and plasma enhancement chemical vapor deposition (PECVD). Compared with the ion implantation technology, CVD has many advantages such as precise composition and structure control for the deposited layer, uniform and fast deposition rate, high throughput, low manufacturing cost, etc.

The metallurgical phase structure of a silicon-containing layer formed by low temperature deposition process such as the PECVD and LPCVD is looser and possesses some structural defects and impurities that can restrain crystallization. The present invention prepares a silicon-containing active layer of the light-emitting device by the APCVD performed at a high temperature. The silicon-containing active layer prepared at high temperature possesses less structural defects and impurities, and complex Si—N—O compounds can form the Si—NC with high compactness and high density. Consequently, the fluorescence spectrum of the Si—NC has high resolution, high-luminance and narrower spectrum half width.

FIG. 1 is a schematic diagram of an APCVD apparatus 100. As shown in FIG. 1, the APCVD apparatus 100 comprises a reaction chamber 10, a high frequency oscillation power supply 12 positioned outside the reaction chamber 10, a graphite block 14 positioned inside the reaction chamber 10, an inlet pipe 16 and an outlet pipe 18. The graphite block 14 is used to support a substrate 22 to carry out layer deposition. Preferably, the graphite block 14 has deposited a thin layer 15 consisting of silicon carbide and silicon dioxide in advance to avoid erosion by the oxygen molecule.

Figure 2:
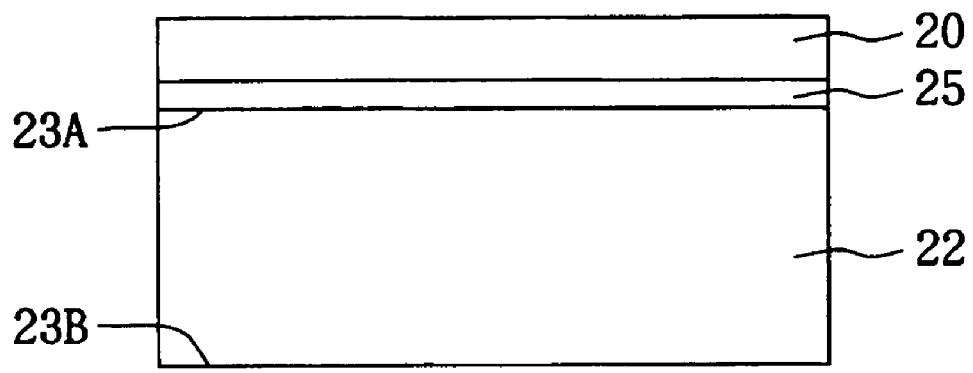
FIG. 2 to FIG. 4 are sectional views showing the method for preparing the infra-red light-emitting device according to the present invention.
Figure 3:
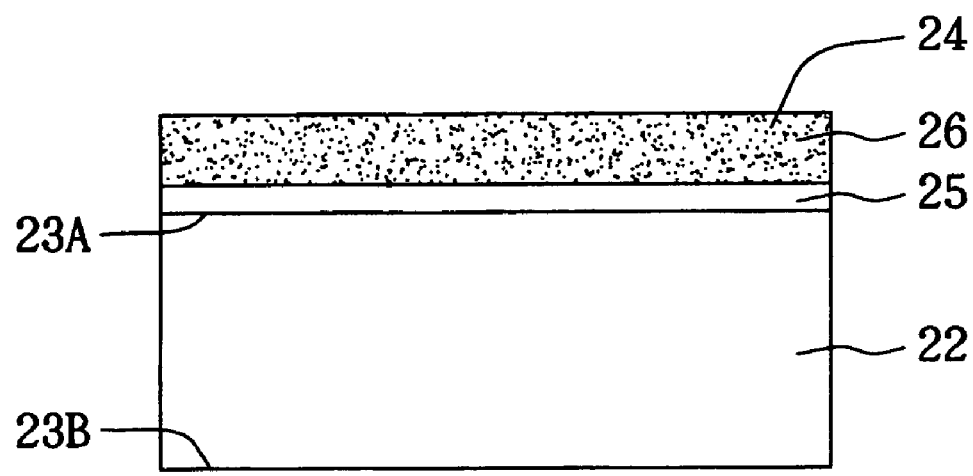
Figure 4:
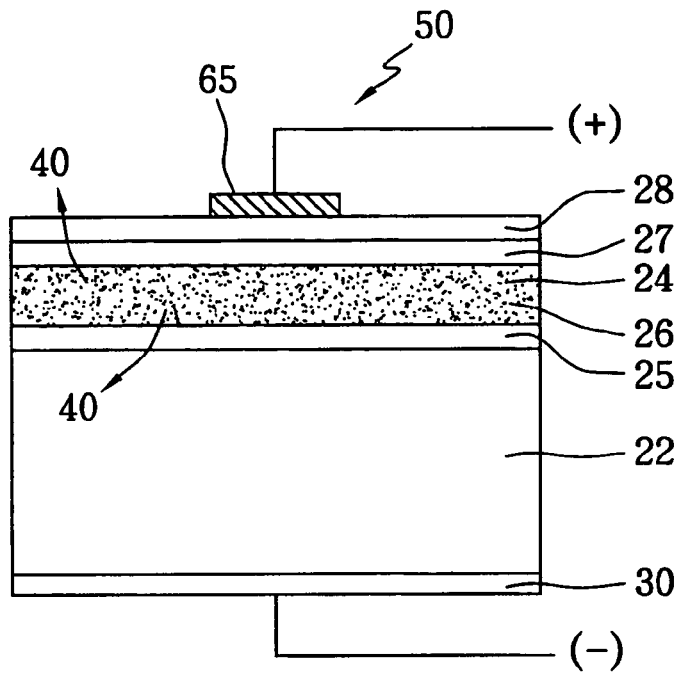

FIG. 2 to FIG. 4 show the method for preparing the infra-red light-emitting device 50 according to the present invention. According to the present invention, the substrate 22 is positioned on the graphite block 14 in the reaction chamber 10, and the high frequency oscillation power supply 12 heats the graphite block 14 to a deposition temperature TD. The substrate 22 can be a p-silicon substrate or an n-silicon substrate with an upper surface 23A and a lower surface 23B. A first window layer 25 is deposited on the upper surface 23A of the substrate 22. Reaction gases 17 with a predetermined molar or volume ratio are mixed uniformly and delivered through the inlet pipe 16 into the reaction chamber 10 by a carrier gas 11 selected from the group consisting of hydrogen, argon and nitrogen. The reacting gas 17 can consist of $SiH_2Cl_2$ and $N_2O$ at a flow ratio or volume ratio between 1:10 and 10:1. In addition, the reacting gas 17 can also consist of $SiH_4$ and $N_2O$ at a flow ratio or volume ratio between 1:10 and 10:1.

The temperature of the reaction chamber 10 is maintained at the deposition temperature $T_D$ for a predetermined period $t_D$ to form a sub-stoichiometric silica ($SiO_x$) layer 20 with excessive silicon atoms on the first window layer 25, wherein the numerical ratio (x) of oxygen atoms to silicon atoms is smaller than 2. Other reaction by-products 19 such as nitrogen ($N_2$) and chlorine hydride (HCl) will be discharged continuously via the outlet pipe 18. Nitrogen (or argon) is then delivered into the reaction chamber 10 to form a nitrogen (or argon) atmosphere, and the temperature of the reaction chamber 10 is maintained at a treating temperature $T_P$ for a predetermined period $t_P$ to carry out a thermal treating process. The atmosphere in the reaction chamber 10 drives excessive silicon atoms in the sub-stoichiometric silica layer 20 to grow crystals so as to transform the sub-stoichiometric silica layer 20 into the silicon dioxide layer 26 with the Si—NC 24 distributed therein.

Hydrogen is then delivered into the reaction chamber 10, and the temperature of the reaction chamber 10 is maintained at a hydrogen passivation temperature $T_{HP}$ for a predetermined period $t_{HP}$ to carry out a passivation process for the Si—NC 24. The thermal treating process incorporates the surface passivation process to transform the sub-stoichiometric silica layer 20 substantially into a silicon dioxide layer 26 with Si—NC 24 completely. The silicon dioxide layer 26 serves as a matrix for the Si—NC 24 to lodge therein, the thickness of the silicon dioxide layer 26 is between 1 and 10,000 nm, and the crystal size of the Si—NC 24 is between 4 and 8 nm.

Please refer to FIG. 4, in which a second window layer 27, a transparent conductive layer 28, and a first ohmic contact electrode 65 are formed in sequence on the silicon dioxide layer 26, and a second ohmic contact electrode 30 is formed on the bottom surface 23B of the substrate 22 to complete the light-emitting device 50. The first window layer 25 and the second window layer 27 are preferably made of microcrystal-SiC (silicon carbide), amorphous-SiC, or gallium nitride (GaN). The first window layer 25, the silicon dioxide layer 26 and the second window layer 27 consist of a PIN junction structure. The transparent conductive layer 28 is preferably made of indium tine oxide (ITO). The first ohmic contact electrode 65 is preferably made of aluminum (Al) or an alloy consisting of nickel (Ni) and Al. If the first ohmic contact electrode 65 is biased to a positive voltage and the second ohmic contact electrode 30 is biased to a negative voltage, respectively, the light-emitting device 50 will be excited by the current to emit the infra-red light 40.

Figure 5:
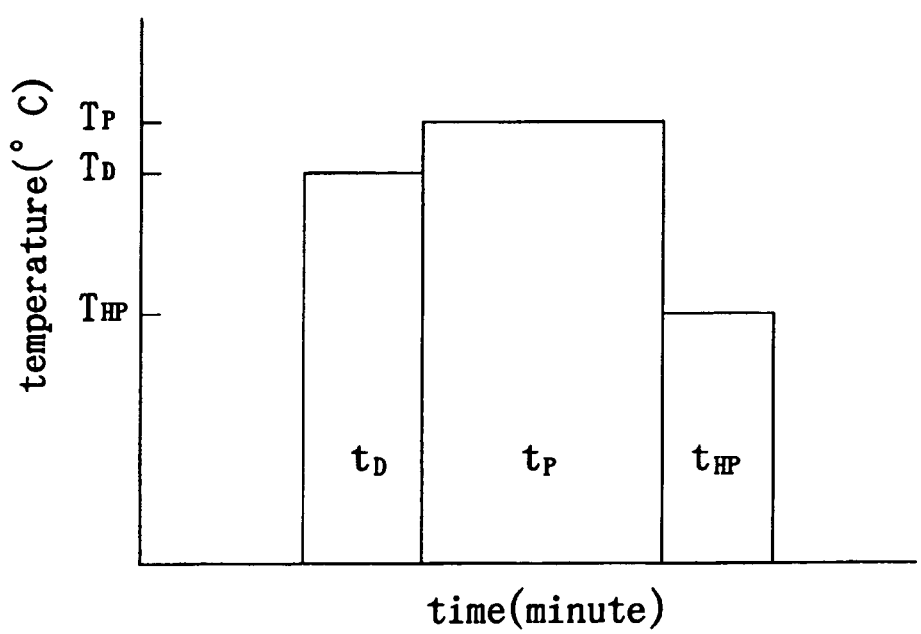
FIG. 5 is a graph illustration showing the operational time and temperature of the deposition process, the thermal treating process and the passivation process according to the present invention.

FIG. 5 illustrates the operational time and temperature of the deposition process, the thermal treating process and the passivation process according to the present invention. As shown in FIG. 5, the deposition temperature $T_D$ is between 700 and 1100° C., and the deposition time $t_D$ is between 1 and 300 minutes. The thermal treating process is performed at the temperature $T_P$ between 800 and 1300° C., and the operational period $t_P$ is between 1 and 300 minutes. The hydrogen passivation process is performed at the temperature $T_{HP}$ between 500 and 600° C., and the operation period $t_{HP}$ is between 1 and 120 minutes.

Figure 6:
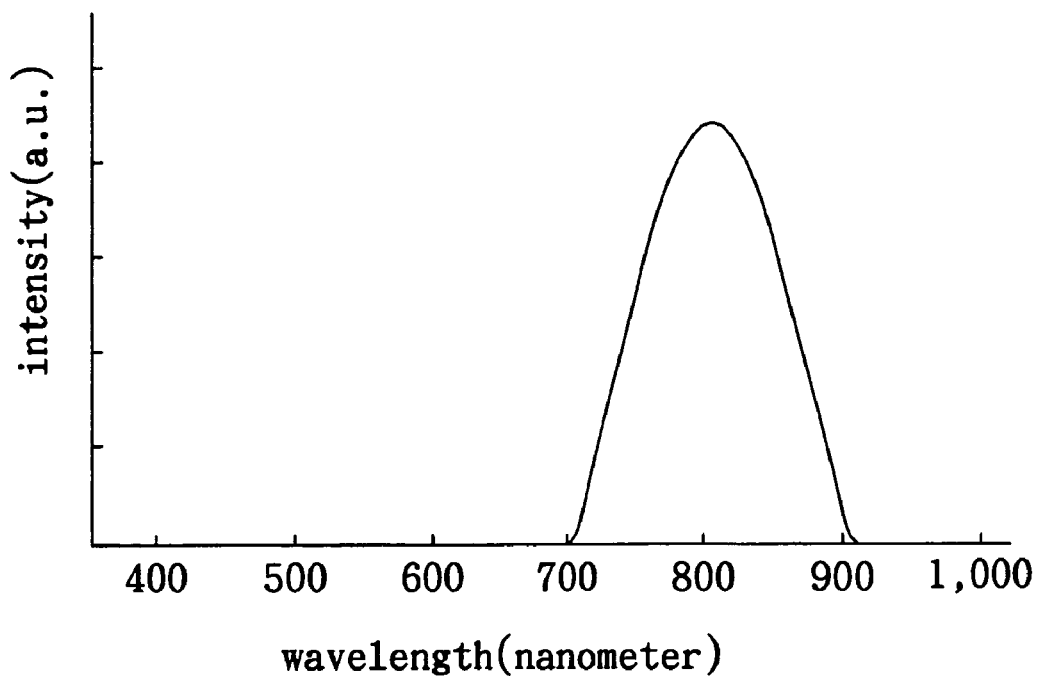
FIG. 6 is a graph illustration of a photoluminescence (PL) spectrum of the silicon nanocrystals in the silicon dioxide layer according to the present invention.

FIG. 6 is a photoluminescence (PL) spectrum of the Si—NC 24 in the silicon dioxide layer 26 according to the present invention. An argon laser beam with a wavelength 488 nm directly irradiates on the silicon dioxide layer 26, and the photoluminescence spectrum emitted by the Si—NC 24 is then measured. As shown in FIG. 6, the wavelength of the photoluminescence emitted by the Si—NC 24 in the silicon dioxide layer 26 is between 700 and 900 nm, and the wavelength of the peak is about 800 to 850 nm, i.e., an infra-red light.

Figure 7:
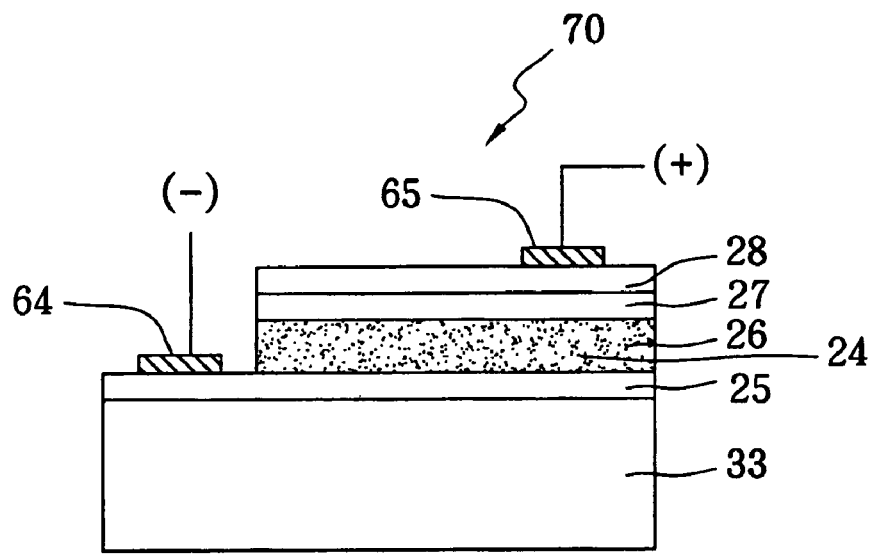
FIG. 7 is a sectional view illustrating a light-emitting device according to the second embodiment of the present invention.

FIG. 7 illustrates a light-emitting device 70 according to the second embodiment of the present invention. As shown in FIG. 7, the light-emitting device 70 comprises a substrate 33, a first window layer 25 positioned on the substrate 33, a silicon dioxide layer 26 positioned on a portion of surface of the first window layer 25, a second window layer 27 positioned on the silicon dioxide layer 26, a transparent conductive layer 28 positioned on the second window layer 27, a first ohmic contact electrode 65 positioned on the transparent conductive layer 28, and a second ohmic contact electrode 64 positioned on another portion of surface of the first window layer 25. The silicon dioxide layer 26 is prepared by the above-mentioned method, therefore it has the Si—NC 24 capable of emitting the infra-red light. The first window layer 25 is n$^+$ type and made of silicon, nickel and gallium, i.e., an n$^+$-GaNiSi layer. In addition, the second window layer 27 can also be made of amorphous-SiC, microcrystal-SiC or gallium nitride. The first window layer 25, the silicon dioxide layer 26 and the second window layer 27 consist of a PIN junction structure. The second ohmic contact electrode 64 can be made of titanium-aluminum alloy and the substrate 33 can be a quartz substrate or a sapphire ($Al_2O_3$) substrate.

The present invention prepares the sub-stoichiometric silica layer 20 by the APCVD process performed at the high temperature; the chemical equation thereof is:

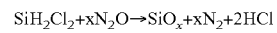

$$SiH_2Cl_2 + xN_2O \rightarrow SiO_x + xN_2 + 2HCl$$

The carrier gas delivers the reaction gas 17 consisting of $SiH_2Cl_2$ and $N_2O$ mixed at a predetermined molar or volume ratio uniformly into the reaction chamber 10 at the deposition temperature ($T_D$) between 700 to 1100° C. In the reaction chamber 10 at the high deposition temperature ($T_D$), both $SiH_2Cl_2$ and $N_2O$ are dissociated into atoms by the high temperature and recombined into sub-stoichiometric silica molecules on the substrate 22. The silica deposited on the first window layer 25 contains excessive silicon atoms, while the relative numerical ratio of oxygen atoms and excessive silicon atoms (O/Si) in the silica can be determined by non-destructive testing. For example, the relative numerical ratio of oxygen atoms and excessive silicon atoms (O/Si) can be determined by measuring the refractive index relative to a standard silicon dioxide ($SiO_2$).

The melting point ($T_M$) of silicon is about 1430° C., and its nucleation temperature ($T_N$) for the crystallization is about $0.6 \times T_M \cong 858°$ C. The deposition temperature TD of the sub-stoichiometric silica layer 20 is between 700° C. to 1100° C., which is obviously beyond the nucleation temperature. Consequently, during the deposition process of the sub-stoichiometric silica layer 20, the reaction chamber 10 at the high temperature (TD) can drive most of the excessive silicon atoms in the sub-stoichiometric silica layer 20 to form Si—NC nucleus and the interstate structure between the Si—NC nucleus and matrix (made up of silicon dioxide). The interstate structure between Si—NC nucleus and matrix comprises dangling bonds around Si—NC and N—O bonds. For example, Si—N bonds, Si—O bonds and Si—$N_x$—$O_y$ bonds. The interstate structure is the major luminescence center.

The annealing process for growing and curing the Si—NC 24 is then performed in the nitrogen or argon atmosphere. The main constitution of the sub-stoichiometric silica layer 20 contains clusters formed of the amorphous silica and the excessive silicon atom, wherein most of excessive silicon clusters have formed Si—NC nucleus. The sub-stoichiometric silica layer 20 is then positioned in the high treating temperature ($T_P$) for a period ($t_P$) to grow all Si—NCs and cure the interstate structure, i.e., to transform the sub-stoichiometric silica layer 20 into the silicon dioxide layer 26 with the Si—NC 24.

In addition, if excessive silicon atoms in the sub-stoichiometric silica layer 20 do not form Si—NC nucleus in the deposition process, the high temperature ($T_P$) during the thermal treating process will further drive excessive silicon atoms in the sub-stoichiometric silica layer 20 to nucleate. The silicon dioxide layer 26 with the Si—NC 24 is then positioned in a hydrogen atmosphere at a predetermined temperature ($T_{HP}$) for a period ($t_{HP}$) to carry out the hydrogen passivation process for the Si—NC 24. After the passivation process, the silicon dioxide layer 26 with Si—NC 24 will form a stable active layer capable of emitting the infra-red light.

Compared with the prior art, the present invention prepares the infra-red light-emitting device 50 with a silicon-containing active layer (i.e. the silicon dioxide layer 26 with the Si—NC 24) by the high temperature APCVD incorporated with the thermal treating process, and possesses the following advantages:

1. Without the complicated epitaxial crystal process and expensive equipment according to the prior art, the present invention needs to deposit the sub-stoichiometric silica layer 20 followed by the thermal treating process. Consequently, the present invention is simpler and faster.

2. The present invention prepares the sub-stoichiometric silica layer 20 by the APCVD process, which can be integrated into standard semiconductor process. Therefore, the present invention can produce great amount of light-emitting device efficiently.

3. The prior art uses III-V group compounds to prepare the active layer of a light-emitting device, therefore the manufacturing cost is high. The present invention uses the silica to prepare the silicon-containing active layer of the light-emitting device 50, so the cost for the material and the manufacturing is relatively lower.

4. III-V group compounds used in prior art will produce toxic chemical substance. The present invention is a green and environmentally friendly process since the silicon-containing active layer of the light-emitting device is prepared by the silica without using and discharging toxic heavy metal.

5. The present invention selects to form sub-stoichiometric silica layer 20 with excessive silicon atoms at the high temperature (TD), and the sub-stoichiometric silica layer 20 is then transformed into the silicon dioxide layer 26 with the Si—NC 24 by the thermal treating process, so the light-emitting device 50 possesses high temperature stability, and the active layer has a narrower width infra-red light spectrum distribution.

6. After the thermal treating process performed at the high temperature (TP), the silicon dioxide (stoichiometric silica) layer 26 with the Si—NC 24 possesses high compactness, high-density distribution and low impurity, so the Si—NC 24 and its interstate structure can generate a clear and high-luminance spectrum.

The above-described embodiments of the present invention are intended to be illustrative only. Numerous alternative embodiments may be devised by those skilled in the art without departing from the scope of the following claims.

We claim:

1. A method of preparing an infra-red light-emitting device comprising:
   providing a substrate;
   forming a sub-stoichiometric silica layer with oxygen atoms and silicon atoms on the substrate, wherein the numerical ratio of the oxygen atoms to the silicon atoms is smaller than 2;
   performing a first thermal treatment in a nitrogen or argon atmosphere at a temperature of between 800 and 1300° C. for a time of between 1 and 300 minutes so as to transform the sub-stoichiometric silica layer into a silicon dioxide layer having a plurality of silicon nanocrystals with a crystal size of between 4 and 8 nanometers; and
   performing a second thermal treatment in a hydrogen atmosphere at a temperature of between 500 and 600° C. for a time of between 1 and 120 minutes.

2. The method of claim 1, said step of forming the sub-stoichiometric silica layer comprising:
   forming the sub-stoichiometric silica layer on the substrate by an atmospheric pressure chemical vapor deposition at an temperature of between 700 and 1100° C.

3. The method of claim 2, the atmospheric pressure chemical vapor deposition having a reaction gases, said reaction gases being dichlorosilane and nitrous oxide.

4. The method of claim 3, the step of forming the sub-stoichiometric silica layer further comprising:
   delivering the dichlorosilane and nitrous oxide into a reaction chamber at a flow ratio of between 1:10 and 10:1.

5. The method of claim 2, the atmospheric pressure of chemical vapor deposition having reaction gases, said reaction gases being silane and nitrous oxide.

6. The method of claim 5, the step of forming sub-stoichiometric silica layer further comprising:
   delivering the silane and nitrous oxide into a reaction chamber at a flow ratio of between 1:10 and 10:1.

7. The method of claim 2, the atmospheric pressure chemical vapor deposition having a carrier gas, said carrier gas selected from the group consisting of hydrogen, nitrogen and argon.

* * * * *